US006270648B1

(12) United States Patent
Yates et al.

(10) Patent No.: US 6,270,648 B1
(45) Date of Patent: Aug. 7, 2001

(54) PROCESS AND APPARATUS FOR THE MANUFACTURE OF HIGH PEEL-STRENGTH COPPER FOIL USEFUL IN THE MANUFACTURE OF PRINTED CIRCUIT BOARDS, AND LAMINATES MADE WITH SUCH FOIL

(75) Inventors: Charles B. Yates, Princeton; George Gaskill, Manahawkin; Ajesh Shah, West Windsor, all of NJ (US); Chinsai T. Cheng, Orange, CT (US); Keith Bodendorf, Mt. Holly; Adam M. Wolski, Edgewater, both of NJ (US)

(73) Assignee: Yates Foil USA, Inc., Bordertown, NJ (US)

( * ) Notice: Subject to any disclaimer, the term of this patent is extended or adjusted under 35 U.S.C. 154(b) by 0 days.

(21) Appl. No.: 09/422,663

(22) Filed: Oct. 22, 1999

(51) Int. Cl.[7] ............... C25D 7/06; C25D 5/10; C25D 5/00
(52) U.S. Cl. .................. 205/138; 205/182; 205/152; 205/111; 205/112
(58) Field of Search ................ 205/138, 182, 205/152, 111, 112

(56) References Cited

U.S. PATENT DOCUMENTS

| 3,674,656 | 7/1972 | Yates | 204/13 |
|---|---|---|---|
| 3,857,681 | 12/1974 | Yates et al. | 29/195 |
| 4,490,218 | * 12/1984 | Kadija et al. | 204/13 |
| 4,572,768 | 2/1986 | Wolski et al. | 204/15 |
| 5,215,646 | 6/1993 | Wolski et al. | 205/77 |
| 5,326,455 | * 7/1994 | Kubo et al. | 2205/77 |
| 5,437,914 | 8/1995 | Saida et al. | 428/209 |
| 5,447,619 | 9/1995 | Wolski et al. | 205/50 |
| 5,779,870 | 7/1998 | Seip | 205/77 |
| 5,833,819 | * 11/1998 | Ohara et al. | 204/206 |
| 5,863,410 | 1/1999 | Yates et al. | 205/585 |

FOREIGN PATENT DOCUMENTS

| WO97/03915 | 7/1987 | (WO) . |
|---|---|---|
| WO 99/16935 | 4/1999 | (WO) . |

OTHER PUBLICATIONS

F.A. Lowenheim, "Electrocleaning," *Modern Electroplating*, John Wiley & Sons, Inc. No date available.
F.A. Lowenheim, "Fundamental Principles: Epitaxy," *Modern Electroplating*, John Wiley & Sons, Inc. No date available.

* cited by examiner

*Primary Examiner*—Edna Wong
(74) *Attorney, Agent, or Firm*—Finnegan, Henderson, Farabow, Garrett & Dunner, L.L.P.

(57) ABSTRACT

A one-step, integrated process and apparatus for producing electrolytic copper foil having a dual-layer copper bond-enhancing treatment electrodeposited on the matte side of the foil, which employs two "super anodes" on a rotating drum cathode to deposit the treatment.

9 Claims, 6 Drawing Sheets

PROCESS AND APPARATUS FOR THE MANUFACTURE OF HIGH PEEL-STRENGTH COPPER FOIL USEFUL IN THE MANUFACTURE OF PRINTED CIRCUIT BOARDS, AND LAMINATES MADE WITH SUCH FOIL

FIELD OF THE INVENTION

This invention relates to electrolytic copper foil, to a process and apparatus for producing such copper foil having a matte side provided with a bond-enhancing treatment, and to a laminate using such foil.

BACKGROUND OF THE INVENTION

A conventional method for the production of copper foil for electronic application, i.e., copper-clad laminates for printed circuit boards, typically involves two steps, first, electrodeposition or plating, of a "base" or "raw" foil on a rotating drum-cathode and, second, passing the "base" foil through a "treater" machine, in order to provide the matte side of the foil with a bondable surface suitable for bonding to a polymeric substrate. The latter step is sometimes called the bonding treatment. Traditionally, these two steps are separated by the foil manufacturers, since they seem to be mutually exclusive in that formation of base foil calls for a concentrated, hot copper sulfate/sulfuric acid electrolyte, in order to yield strong, ductile and compact depositions which form the body of the foil, while the bonding treatment usually requires a more dilute and colder electrolyte which yields fragile, powdery deposits whose role is to enhance the true surface area of the matte side of the foil and this enhance the bonding ability of the foil.

In the typical process, the first step, fabrication of the base foil, or "core," a primary objective is to impart to the bulk of the foil the combination of physical, metallurgical and electrical properties desired in the printed circuit industry. Obviously, those properties are determined by the microstructure, which in turn is determined by purity and conditions of the plating process. Typical properties of the core of the foil sought by printed circuit board manufacturers are suitable tensile strength, yield strength, elongation, ductility and resistance to fatigue. Many of the desired properties relate to the maximum load the material may withstand before failure, and are usually derived from stress-strain curves. Similarly, electrical conductivity is considered an important property of copper foil. All these properties of copper foil depend on the foil's microstructure, but particularly on the microstructure of the core of the foil. This microstructure, responsible for foil's properties, is in turn determined by the electrodeposition conditions.

Similar to other materials used in high technology applications, copper foil is a composite; i.e., it has a near-surface region with properties differing from those of the bulk material. Thus, the bulk of the copper foil (core) serves in printed circuit boards as the conductor of electricity. The bonding side of the foil is responsible for promoting a permanent bond to the polymeric dielectric (insulating) substrate or prepreg, e.g., glass fabric impregnated with epoxy resin.

The above-mentioned first manufacturing step utilizes a large cylindrical drum-cathode which rotates, partially immersed in a copper sulfate-sulfuric acid electrolyte. The drum cathode is adjacent to and facing a pair of curved anodes, which may be formed of lead, lead, lead-antimony, platinized titanium, iridium or ruthenium oxides. Both the drum and the anodes are connected electrically to heavy buss-bars to a DC power source, and currents of up to 50,000 amps or more are commonly used. As the drum rotates in the electrolyte, an electrodeposit of copper forms on the drum surface, and as the latter leaves the electrolyte, the electrodeposited copper is continuously stripped from the rotating drum in the form of thin foil, which is lit to size and wrapped around a take-up roll. The outer surface of the drum is usually formed of titanium or other durable metal.

Foil produced in such a process, prior to being treated, is usually referred to as raw foil. The raw foil is pale pink in color and has two distinctly different looking sides—a "shiny side", the side which was plated onto the drum surface and then stripped is quite smooth, while the other side, the side which was facing toward the electrolyte and the anodes, is referred to as the "matte" side, since it has a velvety finish, due to differences in the growth rate of differing crystal faces during electrodeposition of the "base" foil. The matte side surface, at this stage, has a very fine scale micro-roughness and a very specific micro-topography. Viewed under high magnification of a scanning electron microscope, it is composed of peaks and valleys. The peaks are closely packed cones or pyramids, the height, slant, packing and shape of which depend, as is well known, upon closely controlled independent variables of foil thickness, current density, electrolyte solution composition and temperature, as well as upon the type and concentration of the addition agents in the electrolyte and the like.

The surface quality (profile) of the matte side of the base foil determines its suitability for application as a cladding for copper-clad laminates destined for fine line circuitry and the multi-layer printed circuit boards. The criteria of suitability depends upon the quantitative evaluation of the matte side's surface roughness. A variation which gives useful information about the surface is called "Rz," which is the average deviation from the mean line of the five highest peaks and the five lowest valley within the roughness sampling length.

The matte side of the base foil provides the basic shape of the foil surface for embedding in the resin of a substrate to promote adhesion in the copper clad laminates used in the manufacture of printed circuit boards (PCB's).

While the matte side of the foil has a certain micro-roughness it is not nearly good enough to satisfy industry need for foil's bendability. This is why copper foil manufacturers use the second manufacturing step in which a surface bonding treatment is applied to the matte side of the base foil. The term "bonding treatment" is universally used to describe the changing of the morphology of the matte side of the base foil to make it suitable for bonding to laminate resins.

The bonding treatment operation is conducted in machines called "treaters" where in rolls of raw foil are unrolled in a continuous manner and fed into the treater by means of driven rollers (similar to the way in which a web of paper is handled in a printing machine), rendered cathodic by means of contact rollers and passed in a serpentine fashion through a plurality of plating tanks, facing, in each tank, a rectangular anode. Each tank has its own supply of appropriate electrolyte and its DC power source. Between the tanks the foil is thoroughly rinsed on both sides. The purpose of this operation is to electrodeposit on at least one side of the foil, usually the matte side, copper microprojections of complex shape which ensure that the foil will be firmly anchored to the base polymeric materials used in fabricating the copper clad laminates.

High peel strength (the force necessary to pull apart the copper foil and the supporting insulating substrate material)

is a characteristic of the highest importance, since the mechanical support of the circuit elements, as well as the current carrying capability of PCB's, is provided by the copper foil—polymer joint. It is essential that the foil is bonded very tightly and securely to the substrate and also that such an adhesive joint can withstand all the manufacturing steps in PCB's fabrication without a decrease of the initial adhesion, which, moreover should remain constant throughout the service life of the PCB.

This bonding operation is carried out in laminating plants and involves heating and cooling cycles. Sheets of copper foil are laid upon sheets of "prepreg" (e.g., glass fabric impregnated with epoxy resin). Both materials are placed in a hydraulic press having heated pressing plates, and the two materials are pressed together under high pressure. At elevated temperatures the resin liquefies and is forced, by the pressure, to flow into the micro-irregularities of the foil surface, and both materials are firmly bonded together and very difficult to pull apart. It is the responsibility of the matte side of the foil to ensure high peel strength.

The characteristics of the bonding side of the finished foil, i.e., the base foil plus treatment, result from the combined effects of the micro-topography of the surface of the base foil (electrodeposited at the drum machine) and the bonding treatment plated upon that surface at the treater machine. Both are equally important.

A preferred bonding treatment is effected by subjecting the matte side of the base or "raw" foil to four consecutive electrodeposition steps. The first consists of the deposition of a microdendritic copper layer which enhances, to a very large degree, the real surface area of the matte side, and thus enhances the foil's bonding ability. It is followed by electrodeposition of an encapsulating, or gilding, layer the function of which is to mechanically reinforce the dendritic layer, and thus render it immune to the lateral shear forces of liquid resins in the laminating stage of the PCB's fabrication. Then, a so-called barrier layer is deposited on the dual-layer copper treatment, after which a stainproofing layer is usually applied.

The purpose of the dendritic deposit is to increase the "true" surface area of the matte side since that property is ultimately responsible for the bonding characteristics of the foil. The shape, height, mechanical strength and the number of dendritic microprojections per surface area which constitute dendritic deposit are the factors instrumental in achieving adequate bond strength of the foil, after all stages of the treatment are completed. The dendritic deposit, the first stage of the treatment, is relatively weak mechanically and given to unacceptable treatment transfer characteristics.

The encapsulating step of the treatment is very important, since it eliminates the foil's tendency toward "treatment transfer" and the resulting "laminate staining" which can cause a decrease of the laminate's dielectric properties. The role of this second treatment stage, is to mechanically reinforce the fragile dendritic layer, by overplating it with a thin layer of sound and strong metallic copper, which locks the dendrites to the base foil. Such a dendrites-encapsulation composite structure is characterized by high bond strength and the absence of treatment transfer. The treating parameters which assure just that are relatively narrow. If the amount of the gilding deposit is too low, the foil will be given to treatment transfer. If, on the other hand, the gilding layer is too thick, a partial loss of peel strength may be expected. These first two layers of the treatment are composed of pure copper, in the form of microscopic, spherical micro-projections.

The dual-layer copper bonding treatment may have electrodeposited thereon a very thin layer of zinc or zinc alloy, a so-called barrier layer. During the fabrication of copper clad laminates destined for PCB's, the zinc-containing layer alloys with the underlying all-copper bonding treatment by the process of heat-accelerated diffusion of metals in the solid state. As a result, a layer of chemically stable alpha brass is thus formed over the surface of the all-copper treatment. Its purpose is to prevent direct copper-epoxy resin contact, and this is why the zinc-containing layer (which during lamination is converted to alpha brass), is referred to as a barrier layer. If the bonding treatment were composed of copper only and subjected to lamination with epoxy resin systems, it tends to react with amino groups of the resin, at the high laminating temperatures. This, in turn, may create moisture at the foil-resin interface, causing the harmful effect of "measling", and possibly delamination. The barrier layer plated over the all-copper bonding treatment prevents these harmful effects.

All three stages of the treatment mentioned above, as is well-known in the art, are effected by means of electrodeposition for the purpose of changing the geometry and morphology of the matte side of the foil and assure the mechanical strength of the surface region. (U.S. Pat. No. 3,857,6781, Yates et al.)

Foil treated as described above may then be subjected to an electrochemical stainproofing which changes the surface chemistry. As a result of this step, the bonding surface is rendered chemically stable. This stainproofing operation removes weak surface films, which can greatly decrease the adhesion of the foil to the substrate, and provides a stable film of controlled thickness, responsible for imparting on the treated surface "durability" of its properties.

While the above-described bonding treatment provides copper foil with very satisfactory properties, it requires expensive equipment and transferring the foil to and between the treater foils.

Various patents disclose techniques for combining the base foil manufacture and bonding treatment deposition into a single operation, for example:

U.S. Pat. No. 3,674,656 discloses a technique for making copper foil as a drum-cathode machine using a secondary anode delivering a relatively high current density to promote high-profile, high-bond matte height. While good bonding ability is achieved, the matte side of the foil, by the patent's own description is "highly roughened", in the form of "tree like growth", and would not satisfy the requirement of low-profile cross-section.

International patent No. WO8703915 teaches a technique that combines agitating the electrolyte while using a secondary pulsed current having a current density greater than the limiting current density to produce copper foil having a nodularized outer surface. This technique, however, apparently does not achieve fabrication of low profile foil.

U.S. Pat. No. 5,215,646 (Wolski et al.) and U.S. Pat. No. 5,863,410 (Yates et al.) each disclose a process and apparatus for the production of finished copper foil using a secondary anode, delivering a higher current density than that delivered by the primary anode, to provide a finished copper foil having a high peel strength.

While the latter techniques produce excellent low profile foil, we have found it highly desirable to develop a process and apparatus which enables the production of finished copper foil having matte side surface characteristics which are more uniform from batch-to-batch and from machine-to-machine, and which improve the controllability of the foil-making operation.

International Publication WO 99/16935 discloses a treated electrolytic copper foil where the surface of the shiny side of the raw foil is modified by an electrodeposited copper gilding layer, a copper dendritic layer electrodeposited on the gilding layer, and a second copper gilding layer electrodeposited on the dendritic layer. Further, a second copper dendritic layer may be electrodeposited on the surface of the matte side of the foil and a copper gilding electrodeposited on the second dendritic layer.

U.S. Pat. Nos. 5,437,914, 5,447,619, and 5,779,870 disclose "reverse treated" copper foils for use in the manufacture of multilayer printed circuit boards (MLB's), wherein the foils have a bond-enhancing copper treatment deposited on the shiny side of the foil, and laminates formed by bonding the shiny side of the foil of a polymeric substrate.

SUMMARY OF THE INVENTION

A primary object of the present invention to provide a finished copper foil having a matte side with an improved peel strength and uniform surface characteristics, and to provide improved copper-clad laminates especially useful in the manufacture of MLB's.

Further objects of the invention are a simplified, economic process and apparatus for producing finished copper foil which enable a more easily controllable method of maintaining a more uniform surface on the matte side of the foil during the production of the foil.

Other objects of the invention may become apparent from the following description of the invention and from practice of the invention.

The objects of the present invention may be achieved by a process and apparatus employing the following three steps.

In one aspect of the invention the first step of the process includes providing, in a main electrodeposition zone, a body, or core, of electrodeposited copper foil, the matte side of which has a velvety, matte surface composed of microscopic peaks and valleys, which is due to differences in the growth rate of different crystal faces during the electrodeposition process. The core foil may be produced on a rotating drum cathode machine, in which a rotatable drum immersed in a copper sulfate-sulfuric acid electrolyte is employed as a cathode, and a direct electric current is passed through the electrolyte from one or more curved anodes (hereinafter referred to us the primary anode) to the cathode to electrodeposit copper on the drum. In this first step the electrodeposition is carried out under very favorable mass transfer conditions (which include a moderate current density and a high J/Jdl ratio) selected to assure a dense, strong structure of the deposit, which in turn endows the deposit with good electrical conductivity, strength, ductility and other properties required by the printed circuit and electrical industries.

In the second step of the process the matte side of the foil has electrodeposited on it a copper deposit which is a dense layer of microscopic projections extending outwardly from the foil's surface. These projections are of a dendritic nature (field-oriented isolation type polycrystalline electrodeposits), complex in shape and thus capable of intricate interlocking with the resin of a polymeric substrate in the course of fabricating copper-clad laminates. In this second step a direct electric current is passed, at an extremely high current density, from the anode through a copper sulfate-sulfuric acid electrolyte to the foil (cathodic) to deposit the dendritic layer on the matte side of the foil. In this step the current density is near or reaches the level of the limiting current density and the mass transfer conditions are very poor.

Since the dendritic deposit is quite fragile, it is overplated, in a third step, with an encapsulating layer of mechanically strong copper which locks, or welds, the dendritic deposit to the matte surface of foil body. This encapsulating deposit conforms to the shape and contour of the dendritic deposit (by virtue of epitaxy) and renders it resilient and hard. This third step is carried out by passing a direct electric current from an anode through a copper sulfate-sulfuric acid electrolyte to the foil with the dendritic deposit (cathodic) at a moderate current density and the mass transfer conditions are favorable.

While the above three steps may be carried out separately in different machines, it is highly advantageous to integrate them in a single rotating drum cathode machine having a primary anode for building the body of the foil, a secondary anode for deposition of the dendritic layer and a tertiary anode for deposition of the encapsulating layer, as described herein below. A secondary electrolyte supply conduit is positioned between a downstream end of the primary anode and an upstream end of the secondary anode for injecting a secondary stream of fresh electrolyte into a gap between the secondary anode and the drum cathode to mix with the main electrolyte and sweep generated oxygen bubbles from the surface of the foil opposite the secondary anode.

In accordance with a preferred embodiment, the invention provides an electrolytic process for producing copper foil having a copper bond-enhancing treatment electrodeposited on the matte side of the foil, which process comprises:

(a) providing a core foil prepared by passing an electric current through a circulating main electrolyte containing copper ions from a primary anode to a rotating drum cathode spaced from the primary anode in a first electrodeposition zone under first mass transfer conditions, including a first current density, effective to electrodeposit on the cathode a base copper foil having a fine-grained microstructure and a matte surface having micro-peaks and-valleys;

(b) passing the core foil to a second electrodeposition zone having a secondary anode spaced from the matte surface of the core foil; and (c) flowing a stream of secondary electrolyte containing copper ions into a gap between the secondary anode and the core foil at a laminar flow rate;

(d) passing an electric current through the flowing electrolyte from the secondary anode to the core foil in the second electrodeposition zone under second mass transfer conditions, including a second current density greater than the first current density and at or near the limiting current density, which provide a mass transfer, poorer than that in the first electrodeposition zone, effective to electrodeposit on the matte surface a first layer of copper having the form of columnar microprojections extending outwardly from the matte surface;

(e) passing the core foil having the first layer deposited thereon to a third electrodeposition zone having a tertiary anode spaced from the first layer on the core foil;

(f) flowing the secondary electrolyte from the second electrodeposition zone into a gap between the tertiary anode and the first layer at a laminar flow rate; and (g) passing an electric current through the flowing electrolyte from the tertiary anode to the core foil having the first layer deposited thereon under third mass transfer conditions, including a third current density less than the second current density, which provide a mass transfer better than that in the second electrodeposition zone, effective to electrodeposit on the first layer a mechanically strong second copper layer which encapsulates and conforms to the surface contours of the first layer.

Advantageously, the secondary anode is positioned opposite the drum cathode adjacent a trailing end portion of the primary anode, the tertiary anode is positioned adjacent at a trailing end portion of the secondary anode, the core foil is passed serially on the drum cathode to the second and third electrodeposition zones, the main electrolyte is passed serially from the first electrodeposition zone to the second and third electrodeposition zones, and the secondary electrolyte is injected into the main electrolyte at a point between the trailing end portion of the primary anode and a leading end portion of the secondary anode.

BRIEF DESCRIPTION OF THE DRAWINGS

The accompanying drawings, which form a part of the specification, illustrate a preferred method and apparatus for the practice of a preferred embodiment of the present invention and copper foil in accordance with the invention, and in conjunction with the herein-provided description of the invention, serve to explain the principles of the invention. In the drawings.

DESCRIPTION OF PREFERRED EMBODIMENTS

Figure 4:
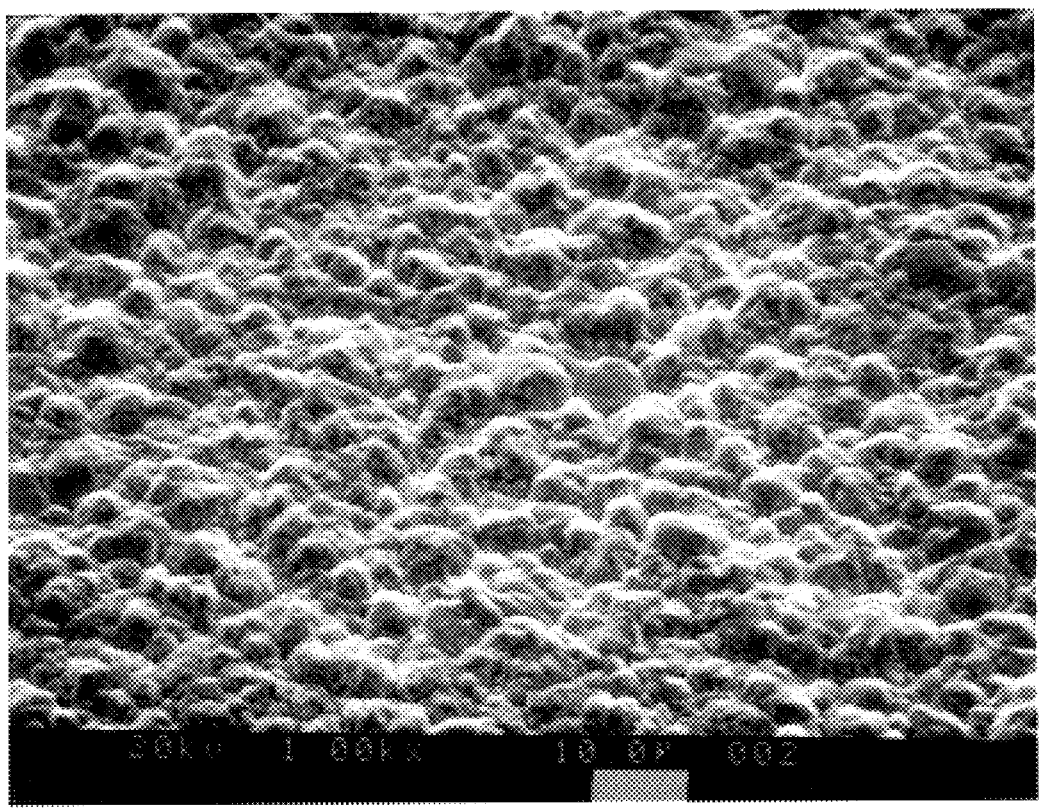
FIG. 4 is a microphotograph (1000×) of the surface of the matte side of a core foil.

The present process produces, on the matte side of the core foil that faces electrolyte in the manufacture of the base (raw foil), as shown in FIG. 4, a dense coating of elongated columnar micro-projections of microscopic size which extend outwardly from the matte surface. This coating greatly enhances the surface area available for bonding in the B-stage lamination of the manufacture of MLBS. The coating greatly increases the roughness factor (the ratio of the surface area to the projected surface area) and thus, assures, after application of a brown oxide treatment (or even without it) much higher bond strength than the bond strength of the matte side of copper foil used for bonding in B-stage lamination, when so-called reverse treated foil is used in manufacture of MLB's, as proposed by: U.S. Pat. No. 5,437,914 to Saida et al.; U.S. Pat. No. 5,447,619 to Wolski et al.; U.S. Pat. No. 5,545,466 to Saida et al.; U.S. Pat. No. 5,779,870 to Seip.

The process and apparatus also provide for application of electrodeposition of a bonding treatment on the shiny side of the foil, preferably according to the process described in WO 99/16935. The apparatus also provides for the electrodeposition onto the surface of the high peel-strength side of the foil of a highly protective but easily removable (by alkaline soak) zinc-containing stain proof layer disclosed in U.S. Pat. No. 5,447,619 to Wolski et al.

Laminates destined for MLBs are prepared by bonding the shiny side of the foil provided with the treatment disclosed in WO 99/16935 to the polymeric substrate. While the high peel-strength side of the foil represents the outer surface of such clad laminates that serves as a surface for photo-imaging and later as a substrate for application of brown-oxide treatment for B-stage lamination (also even without brown oxide treatment) the bondability of the surface is excellent.

The present apparatus can be also used for production of copper foil desired for the standard rigid board applications, in which case the present bonding treatment is deposited on the matte side of the base foil, and a barrier layer is plated over the high peel-strength surface on the matte side of the base foil.

Reference will now be made in detail to the presently preferred apparatus and method of implementing the principles of the present invention, as illustrated in the accompanying drawings, in which like reference characters designate like or corresponding parts throughout the several drawings.

In the first step, there is provided a core, or base, electrolytic copper foil having a matte side and a shiny side which, typically, is produced on a rotating drum cathode machine. Although the base foil may be produced on a separate machine and then provided with the copper bonding treatment described herein, it is highly advantageous to produce the finished treated foil, i.e. the core foil and the present first and second copper layers deposited thereon, in an integrated operation, as described herein below, on the same machine.

Figure 1:
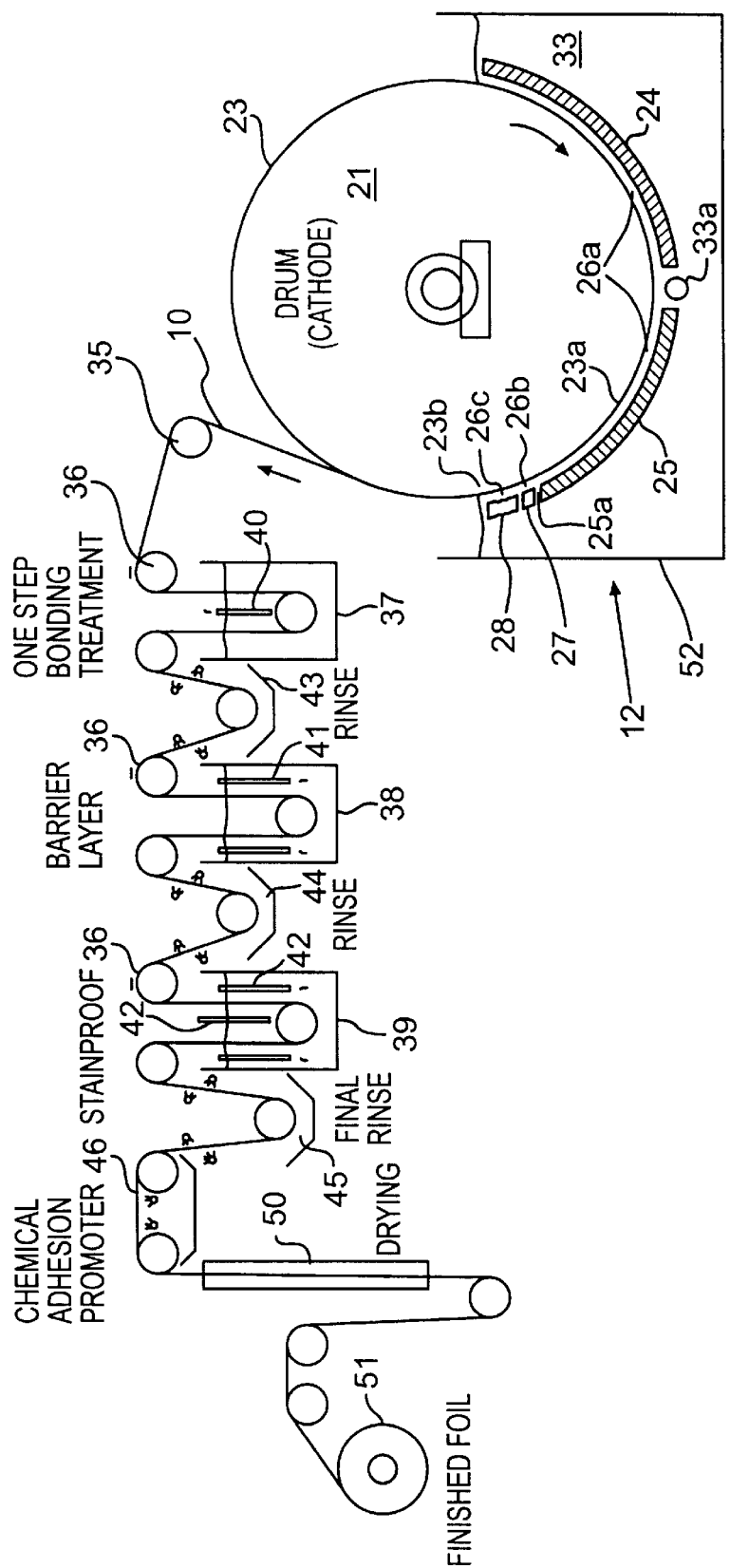
FIG. 1 illustrates a preferred apparatus for producing finished treated foil in accordance with the present invention.
Figure 2:
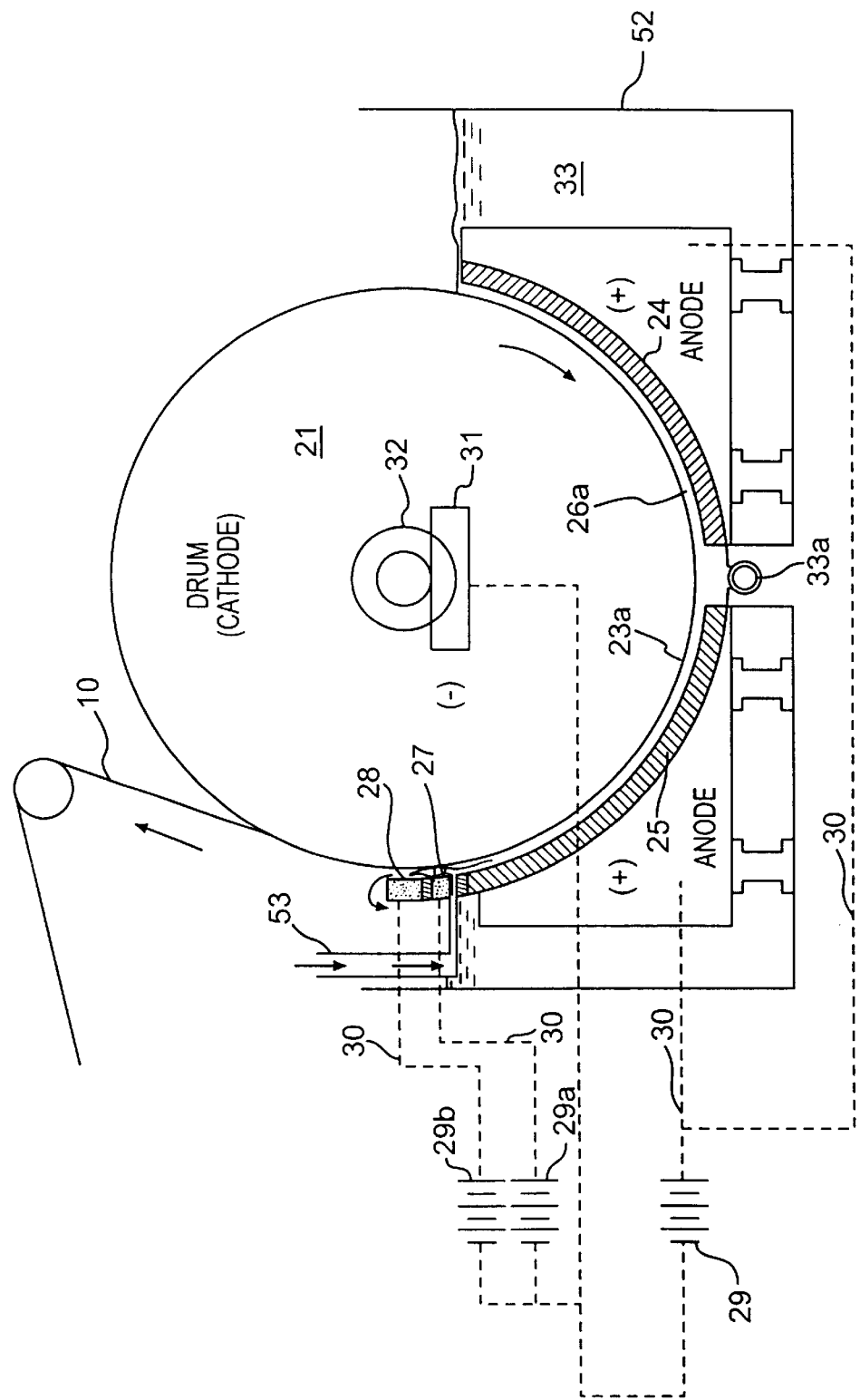
FIG. 2 illustrates an enlarged, partial side view of the drum cathode of the present invention showing the three electrodeposition zones in the apparatus shown in FIG. 1.

As illustrated in FIGS. 1 and 2, fabrication of electrodeposited copper foil according to the invention involves the use of a large (e.g., 2.2 meters in diameter) cylindrical drum-cathode 21. Typically, the drum 21 is constructed and mounted for clockwise rotation about its axis and its outer surface 23 is made of, e.g., stainless steel or titanium. The drum is adjacent to and facing toward an anode, e.g., a pair of heavy, lead (or lead-antimony alloy) curved primary anodes 24 and 25 (insoluble anodes of platinized titanium or iridium or ruthenium oxides can also be used). The surface 23 of drum 21 has a leading portion 23a opposite anodes 24 and 25. The spacing between the nearby facing edges of these anodes provides an entry for the injection of the electrolyte which circulates in the gap 26a between the drum 21 and the inner surfaces of the anodes 24 and 25.

In addition to these two primary anodes 24 and 25, a secondary anode 27, and a tertiary anode 28, "super anodes" are positioned at the exit side of the machine (drum rotates clockwise) and spaced from the drum 21. A trailing portion 23b of surface 23 is located opposite the secondary anode 27 and the tertiary anode 28, and gaps 26b and 26 are provided between anodes 27 and 28, respectively, and the trailing portion 23b. Both the drum and each of the anodes are connected electrically by heavy bus-bars 30 to one of three separate (one for main anodes 24 and 25, another for secondary anode 27, and another for tertiary anode 28) DC power sources 29, 29a and 29b, which are illustratively rectifiers. The busbars are connected to the drum-cathode 21 through contact block 31 and contact ring 32. As the drum rotates in a copper sulfate/sulfuric acid electrolyte 33 and an electrical current (DC) is passed through electrolyte 33 flowing in gaps to electrodeposit of raw copper foil, on the drum surface 23 and as the latter leaves the electrolyte, the electrodeposited copper is continuously stripped from the rotating drum outer surface 23 (since the adhesion between copper electrodeposit and the drum surface is low) in the form of thin foil. The copper ion-containing electrolyte 33 is pumped into the gap 26 through on or more feed lines 33a and the drum 21 is at least partially immersed in the electrolyte. The finished foil 10 at this stage has a matte side (the side facing the electrolyte) and a shiny side (the side facing the drum). The matte side has an improved bonding capability (as will be explained later). As the foil is stripped from the drum surface, it is fed by means of driven roller 35 (similar to the way in which a web of paper is handled in a printing machine) into consecutive plating tanks and subsequently slit into strips and wound on a reel.

As illustrated in FIG. 1, foil 10 is rendered cathodic by means of contact rollers 36 and passes in a serpentine fashion through tanks 37, 38 and 39, facing rectangular anodes 40, 41 and 42, as shown. Each tank has its own supply, respectively, of an appropriate electrolyte and its direct current power source(s). Between the tanks, the foil is thoroughly rinsed on both sides in baths 43, 44 and 45.

The purpose of this latter stage of operation is to electrodeposit on the matte side of the finished foil a barrier layer of zinc or a zinc alloy as described, for example, in U.S. Pat. Nos. 3,857,681 and 4,572,768. The zinc or zinc alloy plating is conducted in the second plating tank 38, while in the third tank 39 the foil is subjected to electrolytic stain-proofing conducted in an aqueous solution of chromium salts, e.g., according to U.S. Pat. No. 3,853,716 or U.S. Pat. No. 3,625,844, but, most preferably, such a solution further containing zinc as disclosed in U.S. Pat. No. 5,447,619.

After the final rinse, but before drying, optionally the matte side of the foil can be sprayed with a dilute solution of a primer (e.g., about 0.3% or 0.5%) of a chemical adhesion promoting agent in station 46, as well-known in the art.

After the foil is dried in dryer 50, it can be slit to a desired width and coiled into a roll 51. Also, at this stage the foil can be inspected and subjected to quality control tests, preparatory to shipping. The present foil manufacturing process can thus be conducted in an integrated operation which does not require the prior art separate dendritic and gilding deposit treatments.

Further, the prior art treatment bonding is avoided in that the rewinding of the film from the roll 51 is not needed; nor is the relatively higher speed of that process needed. Barrier layer deposition, stain-proofing or, optionally, primer application are performed using conventional methods as described in U.S. Pat. Nos. 3,857,681, 4,572,768, 5,447,619, 3,853,716 and 3,625,844, all of which are incorporated herein by reference.

Referring to FIG. 2, at the leading portion 23a of drum-cathode 21, electrodeposition is effected by the passage of electric current across the electrolyte circulating in the anode-cathode gap 26a, an annular compartment formed between the drum-cathode 21 and the curved entry and exit anodes 24 and 25 respectively. This part of the electrolytic cell 52 is referred to herein as the "first electrodeposition zone" or "first zone". If, as an example, drum-cathode 21 has a 2.2 m diameter, is 1.5 m wide, and the drum-anodes distance is 1 cm, only about 45 liters of solution is subjected, at any given time, to the electrolysis. On the other hand, electrolytic cell 52, which is a rectangular tank containing the body of electrolyte, the anodes, and the immersed portion of the drum, and holding about 3,000 liters of electrolyte 33. One or more recirculating pumps inject the electrolyte solution under pressure through conduit 33a into the gap 26a, thus producing an upward flow at a velocity which creates laminar flow conditions in the gap 26a in the first electrodeposition zone.

The system may be equipped with a supply of aqueous solution of grain-refining agent (inhibitor). This solution of, e.g., 5 grams inhibitor per liter (g/l), is prepared in a separate container, and injected by a metering pump, at an appropriate rate, into a line that supplies the machine with fresh electrolyte.

Useful refining agents used in electroplating usually include macro-molecular, water soluble colloids and polymers. Most popular are organic inhibitors such as gelatin, animal glue, cellulose ethers, polyacrylamide, and the like. They can be used separately, but mixtures are preferred, since mixtures can impart to electrodeposits properties impossible to obtain using a single inhibitor. A mixture of gelatin having a low molecular weight (less than 10,000), a higher molecular weight gelatin and a hydroxyalkyl cellulose such as hydroxyethyl cellulose has been found to be highly effective, as disclosed in U.S. Pat. No. 5,215,646, which is incorporated herein by reference. Other grain refining agents which give satisfactory results include a mixture of a low molecular weight water-soluble cellulose ether, a low molecular weight water-soluble polyalkylene glycol ether, a low molecular weight water-soluble polyethyleneimine and a water-soluble sulfonated organic sulfur compound, as disclosed in U.S. Pat. No. 5,863,410, which is incorporated herein by reference.

As the rotating drum-cathode enters the electrolyte in the first electrodeposition zone, a metallic copper deposit is formed on the surface of the drum, and this deposit grows thicker as the process continues, to attain its desired thickness (e.g., 35 microns also called 1 oz. foil) in the first zone. The outer surface of the copper deposit (electrolyte side) acquires a velvety, matte finish composed of microscopic peaks and valleys (as shown in FIG. 4), which is due to differences in the growth rate of different crystal faces, during the electrodeposition process.

The "building" of the "core" or the "body" of the foil typically lasts about 3 minutes, and is carried under very favorable conditions of mass transfer (moderate current density, high J/Jdl ratio), since such conditions assure a dense, strong structure of the deposit which in turn endows copper foil with good electrical conductivity and metallurgical properties required by printed circuit and electronic industries.

After leaving the first electrodeposition zone the rotating drum with the copper electrodeposit adhering to its outer surface passes serially to the secondary and tertiary super-anodes electrodeposition zones.

The purpose of this part of the process is to endow the outer surface of the core foil with excellent bondability, e.g., high peel strength, which calls for entirely different structures of the electrodeposits, and thus different plating conditions, particularly mass transfer conditions, in the latter zones.

This bondability is achieved by plating onto the outer surface of the core foil a very dense coating of microscopic microprojections that are perpendicular to the surface of the foil, complex in shape and thus capable of intricate interlocking with the softened resin in the course of fabrication of copper clad laminates. This super-anode part of the entire process consists of two steps.

Figure 5:
FIG. 5 is a microphotograph (1000×) of the surface of the foil of FIG. 4 after deposition of the dendritic layer of the present invention.
Figure 6:
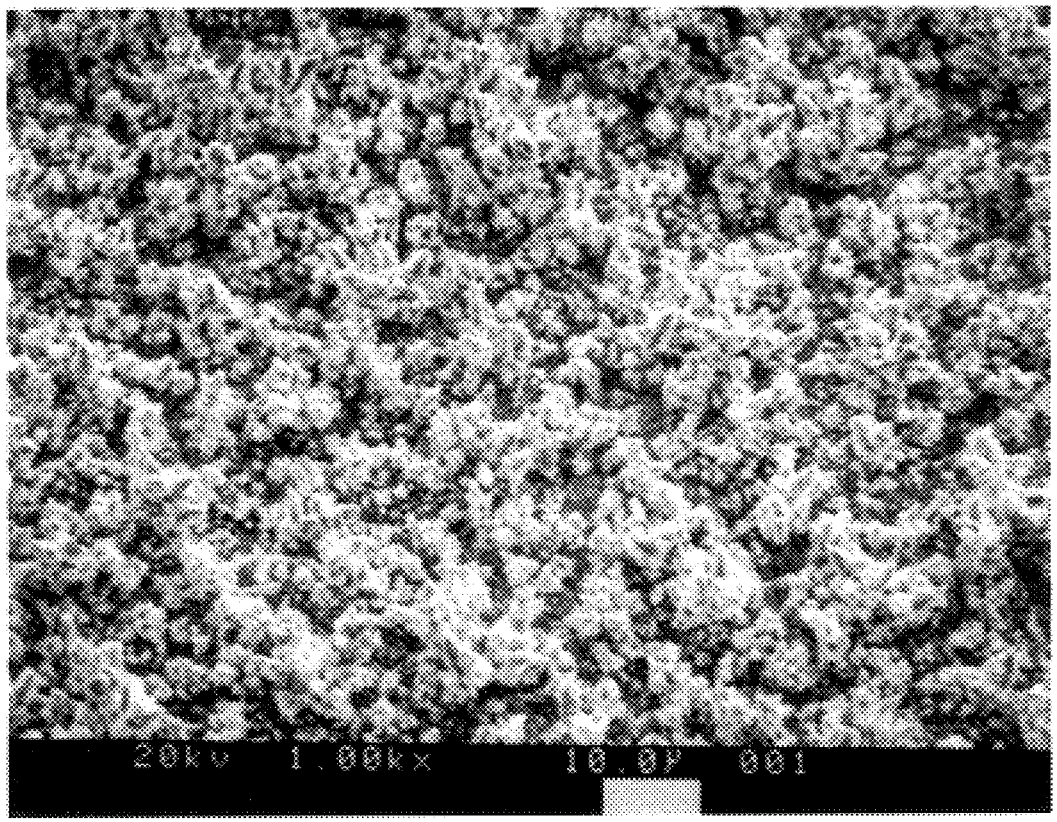
FIG. 6 is a microphotograph (1000×) of the surface of the foil of FIG. 5 after deposition of the encapsulating layer of the present invention.

First, there is a "nucleation" step where the secondary super-anode facing the drum and copper deposit on it, is preferably only about 1 inch high. Thus the drum which rotates with a peripheral speed of about 1 m/min, faces the secondary anode 27 for only about 1.5 seconds. An extremely high current density is applied and electrolysis under such conditions deposits on the outer surface of the core foil a dense coating of microscopic prisms, needles, and dendrites (as shown in FIG. 5) which greatly increases the "true" surface area of this side of the foil and thus makes it potentially very bondable. Since this deposit is however mechanically fragile (needles and dendrites are easy to break), it is overplated in the following tertiary super-anode electrodeposition zone with a coating of mechanically strong and hard copper which, while retaining the complexity of microstructure of the preceding dendritic deposit (as shown in FIG. 6), reinforces it mechanically and "welds" it to the surface of the core foil. This step is achieved in the third electrodeposition zone by employing favorable conditions of mass transfer, with moderate current density and a typical plating time of about 9 seconds (typically, this anode is about 6 inches high).

Because the process variables that affect mass transfer (current density, copper ion concentration, electrolyte temperature, degree of agitation) are not of the same order of magnitude, their effects can be cumulative and interdependent. Thus, by proper choice and quantitative control of these variables one can achieve a desired structure of the electrodeposit which is best suited to fulfill the electrodeposit's technical function.

The electrocrystallization (crystal habit) of electrodeposited metal is affected by the mass transfer of the metal ions to the cathode. In turn, this mass transfer can be characterized by the ratio of the current density and the bulk concentration of the metal ions (C). Conversely, the ratio of current density and the limiting current density (also called diffusion limiting current density, Jdl) may be used to quantify mass transfer. Such ratio may be written as:

$$\frac{J}{Jdl} = \frac{V \times \delta}{n \times F \times D} \times \frac{J}{C}$$

V  Stoichiometric coefficient of Cu++
δ  Diffusion layer thickness
n  Number of electrons involved in cathode reaction (2 for copper)
F  Faraday's constant
D  Diffusion coefficient of metal ions From the above, it may be seen that a shift from one type of electrodeposit's structure to another type of structure can be achieved by shifting the J/Jdl ratio, or the J/C ratio.

To achieve an improved high peel-strength of the outer surface of the foil, the present invention uses super-anode zones of the drum-machine to encourage a unique electro growth of the deposit having a structure which enhances the foil's surface bondability, and the plating parameters in the second electrodeposition zone are purposefully set to achieve the desired structure.

An extremely high current density (although used for only very short time e.g., 1.5 seconds) leads to the high cathodic polarization, or poor mass transport, which enhances the dendritic (tree-like) character of the deposit. What makes the treating process even more complex, is the fact that it is electrodeposited on the matte side of the core foil surface which is not flat, but composed of microscopic peaks and valleys. Treatment technology employs very specific structure of copper electrodeposit to achieve high "bondability" of the matte side of the foil. Dendritic and powdery deposits used in the treatment technology are a specific case of polycrystalline electrodeposits (field-oriented isolation type), and as with all deposits, depend strongly on the rate of formation of new nuclei and the rate of growth of the already existing crystals. The grain size is especially affected by the ratio of these two rates. If the rate of nucleation is small and the rate of crystal crown large, a deposit with coarse grains results. In the contrary case, the deposit is fine grained. Powder formation can then be regarded as a limiting case in which the rate of nucleation and the growth of crystals, particularly their intergrowth, is strongly inhibited. Between the extreme cases of highly dispersed powder and more coherent, well-adhering deposits, many intermediate cases may occur. Only a narrow range of copper particle size and shape combination is well suited to our process. We have mentioned before that powder formation is brought about when the rate of nucleation is large while the growth of crystals is inhibited. These conditions are the consequence of the depletion of copper ions near the cathode (matte side of the foil). It is well established that the depletion of the metallic ions near the cathode is a decisive factor in powder formation. More precisely, powder formation starts when the limiting current is reached or approached, i.e., when the concentration of metallic ions at the cathode-solution interface is zero. The limiting current and, more specifically, the depletion near the cathode, are governed by mass transfer processes.

High peel strength is achieved by subjecting the matte side of the "raw" foil to two consecutive electrodeposition steps. The first consists of the deposition of the microdendritic layer which enhances, to a very large degree, the real surface area of the matte side, and thus enhances the foil's bonding ability. It is followed by electrodeposition of the encapsulating layer, whose function is to reinforce mechanically the dendritic layer and thus render it immune to the lateral shear forces of liquid resins in the laminating stage of PCB's fabrication. The encapsulating step of the treatment is very important, since it eliminates the foil's tendency toward "treatment transfer" and the resulting "laminate staining" which can cause the decrease of the laminates dielectric properties. The shape, height, mechanical strength and the number of dendritic microprojections per surface area which constitute the dendritic deposit are the factors instrumental in achieving adequate bond strength of the foil, after all stages of the treatment are completed. The role of the second treatment stage, is to reinforce mechanically, the fragile dendritic layer, by overplating it with a thin layer of sound and strong metallic copper, which locks dendrites to the base foil structure.

The following electrolyte composition and plating parameters have been found very satisfactory for use in the present process to produce a finished treated foil having a surprisingly high peal strength.

| ELECTROLYTE: Copper sulfate/sulfuric acid | | |
|---|---|---|
| | Most Preferred | Preferred Range |
| Cu (as metal) concentration | 90 g/l | 60–110 g/l |
| H$_2$SO$_4$ | 100 g/l | 40–150 g/l |

-continued

ELECTROLYTE: Copper sulfate/sulfuric acid

| | Most Preferred | Preferred Range |
|---|---|---|
| Grain refining agent(s)-addition weight (dry weight basis) | 600 mg/min | 200–1000 mg/min |
| temperature | 150° F. | 100° F.–180° F. |

Plating Parameters

1. Fresh electrolyte feed rate into the drum-machine tank to support fabrication of copper foil with a current of 25000 Amp at the first, or main, electrodeposition zone.

Most Preferred—120 l/min (liters per minute)

Preferred Range—50–200 l/min

2. Electrolyte's flow rate (volumetric) in the gap between primary anodes and the drum Most Preferred—270 l/min Preferred Range—200–350 l/min 3. Electrolyte's velocity in the gap between primary anodes and the drum Most Preferred—0.3 m/sec (meters per second)

Preferred Range—0.26–0.38 m/sec

4. Current density (direct current) for primary anodes zone

Most Preferred—50 A/DCM$^2$ (amperes per square decimeter)

Preferred Range—20–100 A/DCM$^2$

5. Plating time in the first electrodepositon zone.

Most Preferred—3 min

Preferred Range—2.5–3.5 min

6. Fresh electrolyte feed rate for the secondary and tertiary super-anodes.

Most Preferred—120 l/min

Preferred Range—50–200 l/min

7. Exit velocity of the electrolyte from the aperture of the feed channel for the secondary and tertiary super-anodes.

Most Preferred—0.44 m/sec

Preferred Range—0.40–0.48 m/sec

8. Electrolyte velocity in the gap between secondary and tertiary super-anodes and the drum Most Preferred—0.433 m/sec Preferred Range—0.40–0.48 m/sec.

9. Current density for the electrodeposition in the secondary super-anode zone.

Most Preferred—600 A/DCM$^2$

Preferred Range—500–700 A/DCM$^2$

10. Plating time in the secondary super-anode zone.

Most Preferred—1.5 sec.

preferred Range—1.2–1.8 sec.

11. Current density for the electrodeposition in the tertiary super-anode zone.

Most Preferred—100 A/DCM$^2$

Preferred Range—80–120 A/DCM$^2$

12. Electrodeposition time in the tertiary super-anode zone.

Most Preferred—9 sec.

Preferred Range—7–11 sec.

Figure 3:
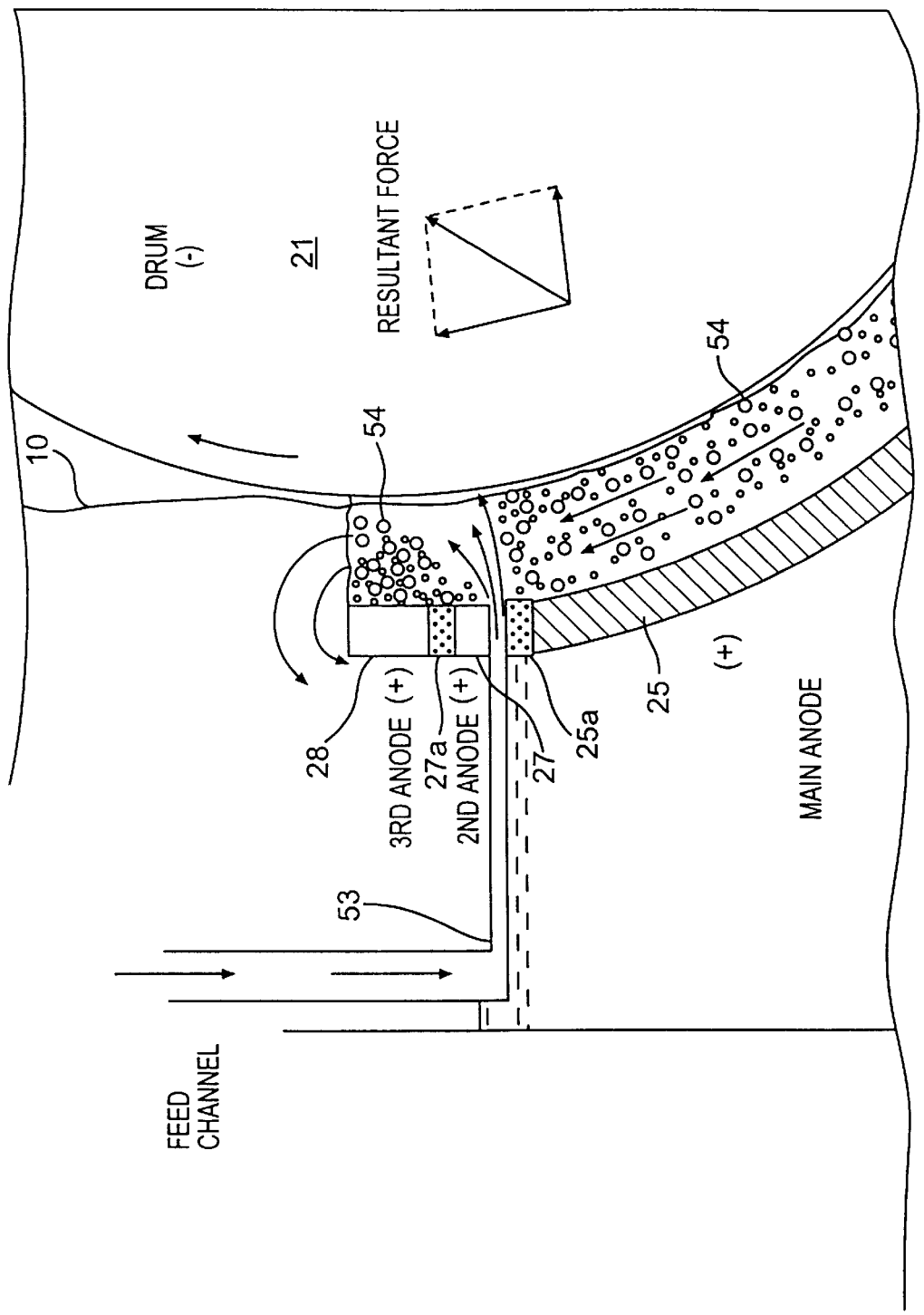
FIG. 3 is an enlarged, partial side view of the apparatus of FIG. 2 illustrating the injection of secondary electrolyte into the circulating primary electrolyte to sweep oxygen bubbles from the outer surface of foil on the drum cathode.

Referring to FIGS. 2 and 3, in the first electrodeposition zone the core foil is deposited on the surface 23a of drum 21 by passing direct electric current from primary anodes 24, 25 through electrolyte flowing in gap 26a to cathode 21. The core foil deposited on the rotating drum passes to the second electrodeposition zone adjacent the trailing end portion of primary anode 25, where there is positioned secondary anode 27, which is spaced from the drum to provide a gap through which electrolyte in gap 26a can flow. Primary anode 25 is electrically insulated from secondary anode 27 by a dielectric material insulator 25a positioned between a terminal end portion of anode 25 and a leading end portion of secondary anode 27, as is secondary electrolyte conduit 53 which is used to inject a secondary electrolyte stream into the main electrolyte stream flowing in gap 26a and toward the drum, so that the mixed electrolyte stream flows through the gap between the secondary anode and the foil deposited on the drum 21. A direct electric current is passed from secondary anode 27 through the mixed electrolyte to the deposit on the drum to deposit a first layer of dendritic copper on the matte side of the core foil in the second electrodeposition zone.

The core foil with the first layer is then passed on the drum to the third electrodeposition zone comprising tertiary anode 28 spaced from drum 21 and positioned adjacent a terminal end portion of the secondary anode. The tertiary anode is electrically insulated from the secondary anode and dielectric material 27a and is positioned between a terminal end position of secondary anode 27 and a leading end portion of tertiary anode 28. In this third zone the mixed electrolyte stream flows from the second anode-cathode gap into a gap between the tertiary anode and the foil on the drum, and a direct electric current is passed from the tertiary anode through the electrolyte to the deposit on the drum to electrodeposit a second encapsulating layer of copper on the first layer in the third electrodeposition zone to produce the finished treated foil, which is then stripped from the drum.

In the first (main) electrodeposition zone plating conditions are selected which assure good micro-structure of the core (base) copper foil. The electrodeposition is carried out below the practical limiting current density. "Demand" for the ions (current density) must not come too close to the "supply" (mass transport) in terms of J/Jdl discussed above. Of all the forms of mass transport in the electrodeposition of copper, the convection, or more precisely, the agitation of the electrolyte is most effective in bringing a supply of copper ions to the surface of the cathode. Traditional methods of fabrication of the base foil provide, by natural means, a moderately good degree of agitation, by means of "natural" convection. If, as an example, the drum cathode has a 2.2 m diameter, is 1.5 m wide, and the drum-anodes distance is 1 cm, only about 45 liters of solution is subjected, at any given time, to the electrolysis. What permits this small volume of electrolyte to support a relatively high rate of the electrodeposition of the foil is the fact that this 45 liters of electrolyte is constantly refreshed and vigorously circulated through the anodes-drum gap. This agitation of the electrolyte is by the high degree of convection that is the result of the discharge of oxygen on the surface of the anodes. By way of example, a current of 25,000 amps generates, at the anodes, 1.4 liters of oxygen every second. The usual process at the surface of the lead anode is the discharge of hydroxyl ions (derived from dissociation of water) resulting in oxygen evolution:

$$4\ OH-4e=2H_2O+O_2 GAS$$

This oxygen mixes intimately with the electrolyte, in the form of gas bubbles, decreases its specific gravity, creating an effect of buoyancy and an energetic upward motion lift. This-effect is additionally increased by the rate at which the electrolyte is pumped into the feed-pipe. This gives the electrolyte contained in an annular compartment between the drum and the anodes an upward direct flow of remarkable velocity. This, in turn motivates electrolyte from the machine tank to be "sucked-in" into the gap through the space between the main anodes, and thus a pattern of energetic, continuous agitation in the gap is established. It has been established that electrolyte's velocity provided by this "natural" convection is about 0.3 m/sec (laminar flow). This mode of transport, in turn, permits the use of current densities of about 50 to 60 amperes per square decimeter and permits to produce 700 kg to 800 kg of base foil per machine per day.

Copper foil in accordance with the present invention was made on a drum plating machine equipped with the above-described two super-anodes and employing the most preferred plating parameters and electrolyte described above.

The foil was provided with a zinc containing stain proof layer according to the process disclosed in U.S. Pat. No. 5,447,619 to Wolski et al. The resulting foil was then laminated to an epoxy/glass fiber prepreg and the peel strength was measured and found to be 11 lbs/inch.

Another sample of the same foil was subjected to brown oxide treatment, laminated and tested for peel strength which was found to be 12.5 lbs/inch.

In another exercise, a sample of 1 oz. foil was made on the same drum plating machine, with the two super-anodes in an OFF position in regard to the current supply from their respective rectifiers. Only the main anodes were in operation, which is a standard way of producing conventional copper foil. This foil was laminated (matte side to the same prepreg), tested for peel strength which was found to be 4 lbs/inch. Then the same foil was provided with a brown oxide treatment, and in this case displayed a peel strength of 7 lbs/inch.

Also, when the shiny side of the same foil is provided with an electrodeposited bonding treatment according to the process disclosed in WO 99/16935, and this surface is bonded to a polymeric substrate, thus forming a copper clad laminate with the high peel strength surface (according to present invention) being an outer surface of the laminate, this latter surface assures excellent photo resist adhesion and, later, excellent bondability in b-stage lamination.

The apparatus for production of high peel-strength copper foil is also useful in fabrication of copper foil destined for the manufacture of rigid, one or two sided copper clad laminates in which the shiny side of the foil represents the outer surface of the laminate. In this case, the drum-cathode part of the process remains as described above, foil is peeled off the drum surface and guided through the series of tanks as described above, but the following elements of the process are changed:

While the foil is guided through tank 37, electrodeposition is not carried on, and the rectifier is OFF.

A barrier layer is electrodeposited onto the high-peel-strength side of the foil, i.e., on the treatment of the present invention, according to the process disclosed in U.S. Pat. No. 4,572,768 to Wolski et al.

A stain proof layer is electrodeposited to the shiny side of the foil according to the process disclosed in U.S. Pat. No. 5,447,619 to Wolski et al.

A chemical adhesion promoter is sprayed onto the high-peel strength side of the foil.

We have produced 1 oz. foil according to all conditions and parameters described above and after laminating this foil, high peel-strength side toward the prepreg, we have tested the peel-strength of the joint, which was found to be 12.4 lbs/inch.

It should be noted that the fresh electrolyte feed into the "gap" of the super-anode zone is considered a very important feature of our invention for the following reasons.

First, a distinction has to be made between the electrolytes which are fed into the primary electrodeposition zone and the super-anode zone.

The "gap" between the main anodes and the drum, which are separated by a distance of about 1 cm., is an annular compartment which holds about 22.5 liters volume of electrolyte per each main anode, where the actual electrodeposition of the copper foil takes place.

In sharp contrast, the tank that contains the rotating drum-cathode, the anodes and the electrolyte, holds a volume of about 3000 liters of electrolyte.

Fresh electrolyte is delivered into the proximity of the anodes-drum (cathode) gap, but is not force fed into this gap. The electrolyte enters the gap and exits it, continuously, as a result of convection caused by the electrolyte's buoyancy, which in turn results from the liberation of the oxygen at the anodes.

The usual process at the surface of the lead anode is the discharge of hydroxyl ions derived from dissociation of water

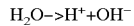

$$H_2O \rightarrow H^+ + OH^-$$

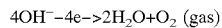

$$4OH^- - 4e \rightarrow 2H_2O + O_2 \text{ (gas)}$$

This oxygen, in the form of gas bubbles, intimately mixes with the electrolyte, decreases its specific gravity, thus creating a buoyancy effect with an energetic upward lifting motion. This gives the electrolyte, contained in the annular compartment between the drum and the anodes, an upward flow of remarkable velocity. This, in turn, motivates electrolyte contained in the machine tank to be sucked into the gap through the space between the main anodes, thus establishing a pattern of energetic, continuous agitation in the gap. This effect is additionally increased by the rate at which the fresh electrolyte is delivered into the feed-pipe.

Naturally, the amount of oxygen liberated at the anodes is stoichiometrically related to the amount of electric current used in the plating process, according to the Faraday's law.

In the drum-machine that fabricates base foil 60 inches wide, with the cathode-anodes distance of 1 cm. and the current of 25,000 Amperes, the evolution of oxygen provides an electrolyte velocity which we measured to be 0.3 m/sec. since the cross-section of the gap is 0.015 $m^2$ the volumetric flow within the main drum-anodes gap is 0.0045 $m^3$/sec or 270 liters/minute.

It will be appreciated that the agitation of the electrolyte in the main anodes zone is provoked by the oxygen evolution at the anodes, described above (the supply of 120 l/min of the fresh main electrolyte through the feed pipe serves merely the purpose of maintaining the concentrations of copper sulfate, sulfuric acid, addition agents, and temperature at the appropriate level).

The high degree of agitation creates conditions of excellent mass transfer, which together with moderate current density, help to electrodeposit in the main (first) electrodeposition zone, the "core' of the copper foil, whose microstructure, as a result of these conditions, endows the foil with the metallurgical and electrical properties desired by the printed circuit industry.

The oxygen bubbles admixed into the electrolyte, further improve the mass transfer by providing an impingement and a scrubbing action on the surface of cathode (outer surface of copper deposit) which greatly reduce the thickness of the diffusion layer and thus increase the limiting current density.

For example, in a typical drum machine operated with a current of 25,000 Amps., i.e., 12,500 Amps for each main anode, at "exit" main anode 12,500 A provokes liberation of 1.036 grams of oxygen, every second, and the volume of that amount of oxygen at 150° is about 0.9 liters.

Since the electrolyte's feed rate into the gap is about 270 l/min, or 4.5 l/sec, the electrolyte's replenishment rate in the gap is about 5 seconds.

In the course of 5 seconds 4.5 liters of oxygen is generated in the gap, which means that the oxygen in the form of gas bubbles, represents about 20% of the volume of the liquid (or rather "foam") in the gap The gap in the super-anodes zone of the treatment electrodeposition zone (secondary and tertiary anodes combined) is an annular compartment that contains about 3.5 liters of electrolyte (the distance between anodes and the drum being 1 cm.), and the cross-section of this gap is 0.015 $m^2$ therefore, the secondary electrolyte's flow of 120 l/min fed directly into the gap underneath super-anode zone, generates an electrolyte velocity of about 0.133 m/sec in the gap. This velocity, combined with the velocity of 0.3 m/sec of the stream of main electrolyte moving upward from the main (first) electrodeposition zone, gives an electrolyte velocity of 0.433 m/sec in the super-anodes zone, and the volumetric flow in the super-anodes zone is 390 l/min (270 l/min+120 l/min) or 6.5 l/sec.

Referring to FIG. 3, what is very important to the workings of this invention is the fact that the introduction of the secondary electrolyte into the super-anodes gap lowers for a few very important seconds, the oxygen content in the volume of the electrolyte. The stream of secondary electrolyte (with no oxygen bubbles) of 120 l/min or 2 l/sec meets the stream of main electrolyte of 270 l/min or 4.5 l/sec. that contains 20% oxygen. Thus, the combined stream of 6.5 l/sec contains about 14% (volume) of oxygen bubbles.

Although the oxygen content in the electrolyte is subsequently increased, this temporary decrease in oxygen content, and particularly the distribution of the bubbles across the anode-cathode gap in the first super-anode zone (second electrodeposition zone) is very important in that, together with the very high current density it helps to create conditions of poor mass transfer (J/Jdl ratio), which increases the thickness of diffusion layer, lowers the limiting current density, and thus makes possible the existence of plating conditions that encourage the structure of electrodeposit in the form of columnar, tree-like micro-projections extending outwardly from the core foil and which provide a bondable, high peel strength surface.

The super-anodes, both secondary and tertiary, with their combined current of about 4500 Amps, generate about 0.32 liters of oxygen per second. Considering the 3.5 liters volume of the electrolyte contained in the super-anodes section gap is replenished in only about 0.5 sec by the upwardly moving electrolyte, the rate of admixing of oxygen into the electrolyte in the super-anodes zone is about 4.5%, which together with the 14% oxygen content discussed above, gives 18.5% (volume), close to the original 20% (volume).

As the drum, with the copper deposit plated onto it, leaves the main (first) electrodeposition zone, the electrolyte facing it, in the gap, moves upwardly with a velocity of about 0.3 m/sec. The electrolyte contains about 20% (vol.) oxygen, with the bubbles distributed uniformly across the gap, strongly scrubbing and impinging on the outer surface of the copper deposit.

At that point as shown in FIG. 3, the stream of the main electrolyte encounters a jet of the fresh secondary electrolyte (with no oxygen bubbles) that exits the rectangular aperture of conduit 53 that feeds the fresh secondary electrolyte into the gap, and which is positioned underneath the first (secondary) super-anode.

The aperture is typically 60" (150 cm) wide and 3 mm high; therefore, a 120 l/min flow generates an exit velocity of the electrolyte which is 0.44 m/sec, about 50% higher than the velocity of 0.3 m/sec. of upward moving liquid in the main mode gap. Since the jet of the fresh electrolyte is preferably perpendicular to the direction of upwardly moving main electrolyte stream from the main gap, and the jet is about 50% faster, the vector relationship of these quantities causes the jet of the fresh electrolyte to traverse the "gap" and sweep away the oxygen bubbles near the outer surface of the copper deposit, for a duration of about 1.5 seconds or so, and a dense coating of dendrites is plated onto the outer surface of the core foil carried on the drum, with the very high current density, and momentary decrease in the content of oxygen bubbles contributing toward achieving the desired micro-structure of the dendritic deposit.

Eventually, the jet of the secondary electrolyte loses its velocity since it expands from the very narrow channel of the aperture to the larger cross-section of the tertiary anode-cathode gap, and, moreover, the super-anodes create new oxygen bubbles. A homogenous distribution of the bubbles is re-established, which recreates conditions of the good mass transfer for the third (encapsulation) electrodeposition zone which creates favorable plating conditions for the deposition on the dendritic deposit of a hard and compact copper layer that mimics the shape of the dendritic layer, but reinforce it mechanically and lock it or weld it to the base foil.

Having described preferred embodiments of our invention, it should be understood that variations and modification thereof falling within the spirit of the invention may become apparent to those skilled in the art, and the scope of our invention is to be determined by the appended claims and their equivalents.

What is claimed is:

1. An electrolytic process for producing copper foil having a bond-enhancing treatment electrodeposited on a matte side of the foil, which process comprises:

(a) providing a core foil by passing an electric current from a primary anode through a main electrolyte stream containing copper ions flowing in a first gap between a rotating drum cathode and the primary anode in a first electrodeposition zone under first mass transfer conditions, including a first current density, effective to electrodeposit on the cathode a core copper foil having a fine-grained microstructure and a matte side with a matte surface having micro-peaks and-valleys;

(b) passing the core foil to a second electrodeposition zone having a secondary anode spaced from the matte surface of the core foil and passing the main electrolyte stream into a second gap between the secondary anode and the core foil;

(c) flowing a stream of secondary electrolyte containing copper ions into the second gap between the secondary anode and the core foil to mix with the main electrolyte stream in the second gap and form a mixed electrolyte stream;

(d) passing an electric current from the secondary anode through the mixed electrolyte stream to the core foil in the second electrodeposition zone under second mass transfer conditions, including a second current density greater than the first current density and at or near the limiting current density, which provide mass transfer conditions poorer than that in the first electrodeposition zone, and which are effective to electrodeposit on the matte surface of the core foil a first layer of copper having the form of elongated micro-projections extending outwardly from the matte surface;

(e) passing the core foil having the first layer deposited thereon to a third electrodeposition zone having a tertiary anode spaced from the first layer on the core foil;

(f) flowing the mixed electrolyte stream from the second electrodeposition zone into a third gap between the tertiary anode and the first layer and (g) passing an electric current through the mixed electrolyte stream from the tertiary anode to the core foil having the first layer deposited thereon under third mass transfer conditions, including a third current density less than the second current density, which provide a mass transfer better than that in the second electrodeposition zone, and which are effective to electrodeposit on the first layer a mechanically strong second layer of copper which encapsulates the first layer and conforms to the surface contours of the first layer.

2. The process of claim 1, wherein the secondary anode is positioned adjacent a trailing end portion of the primary anode, the tertiary anode is positioned adjacent a trailing end portion of the secondary anode, the core foil is passed serially on the drum cathode from the first electrodeposition zone to the second and third electrodeposition zones, the main electrolyte stream is passed serially from the first electrodeposition zone to the second and third electrodeposition zones, and the secondary electrolyte is injected into the main electrolyte stream at a point between the trailing end portion of the primary anode and a leading end portion of the secondary anode.

3. The process of claim 2, wherein each of the main electrolyte stream and the secondary electrolyte is an aqueous solution containing from about 60 to 110 grams per liter of copper ions and from about 40–150 grams per liter of sulfuric acid, and the electrolyte is maintained at a temperature in the range of from about 100° F. to about 180° F.

4. The process of claim 3, wherein the electrolytes further include one or more grain-refining agents.

5. The process of claim 2, wherein the first current density is from about 20 to about 100 A/DCM$^2$, the second current density is from about 500 to about 700 A/DCM$^2$, and the third current density is from about 80 to about 120 A/DCM$^2$.

6. The process of claim 1, wherein the stream of secondary electrolyte is injected into the main electrolyte stream at an angle to the main electrolyte stream.

7. The process of claim 6, wherein angle of injection is substantially perpendicular to the main electrolyte stream.

8. The process of claim 1, wherein the velocity of the mixed electrolyte stream is greater than that of the main electrolyte stream in the first electrode disposition zone.

9. The process of claim 1, wherein the secondary electrolyte is fresh electrolyte.

* * * * *